United States Patent
Belousov et al.

(10) Patent No.: US 9,023,437 B2
(45) Date of Patent: May 5, 2015

(54) CERAMIC COATING DEPOSITION

(75) Inventors: Igor V. Belousov, Kyiv's Region (UA);
Yuriy G. Kononenko, Kyiv (UA);
Anatoly Kuzmichev, Kiev (UA); John F. Mullooly, Jr., Oklahoma City, OK (US)

(73) Assignee: United Technologies Corporation, Hartford, CT (US)

( * ) Notice: Subject to any disclaimer, the term of this patent is extended or adjusted under 35 U.S.C. 154(b) by 308 days.

(21) Appl. No.: 13/471,543

(22) Filed: May 15, 2012

(65) Prior Publication Data

US 2013/0309419 A1   Nov. 21, 2013

(51) Int. Cl.
*H05H 1/24* (2006.01)
*C23C 14/00* (2006.01)
*C23C 14/32* (2006.01)

(52) U.S. Cl.
CPC .......... *C23C 14/0021* (2013.01); *C23C 14/32* (2013.01)

(58) Field of Classification Search
CPC ...... C23C 14/0021; C23C 14/32; C23C 14/16
USPC .................................. 427/569–579
See application file for complete search history.

(56) References Cited

U.S. PATENT DOCUMENTS

| | | |
|---|---|---|
| 4,405,659 A | 9/1983 | Strangman |
| 5,652,044 A * | 7/1997 | Rickerby ............ 428/216 |
| 5,660,885 A | 8/1997 | Hasz et al. |
| 5,871,820 A | 2/1999 | Hasz et al. |
| 5,914,189 A | 6/1999 | Hasz et al. |
| 6,060,177 A | 5/2000 | Bornstein et al. |
| 6,110,604 A * | 8/2000 | Rickerby ............ 428/623 |
| 6,465,090 B1 | 10/2002 | Stowell et al. |
| 6,627,323 B2 | 9/2003 | Nagaraj et al. |
| 6,720,038 B2 | 4/2004 | Darolia et al. |
| 7,226,668 B2 | 6/2007 | Nagaraj et al. |
| 7,416,788 B2 | 8/2008 | Floyd et al. |
| 7,509,734 B2 | 3/2009 | Memmen et al. |
| 7,838,083 B1 | 11/2010 | Youchison et al. |
| 2006/0278518 A1 | 12/2006 | Kouznetsov |
| 2008/0131611 A1 | 6/2008 | Hass et al. |
| 2009/0184280 A1 | 7/2009 | Lee |
| 2009/0186237 A1 | 7/2009 | Lee |
| 2009/0324989 A1 | 12/2009 | Witz et al. |
| 2010/0154425 A1 | 6/2010 | Litton et al. |
| 2010/0155224 A1 * | 6/2010 | Belousov et al. ...... 204/192.11 |
| 2010/0196684 A1 | 8/2010 | Memmen et al. |
| 2010/0258437 A1 | 10/2010 | Cheong et al. |

FOREIGN PATENT DOCUMENTS

| | | |
|---|---|---|
| JP | 2003-073814 A | 3/2003 |
| KR | 10-0881954 B1 | 2/2009 |

OTHER PUBLICATIONS

International Search Report and Written Opinion for PCT/US2013/040895, dated Aug. 23, 2013.
International Preliminary Report on Patentability for PCT/US2013/040895, dated Nov. 18, 2014.

* cited by examiner

*Primary Examiner* — Elizabeth Burkhart
(74) *Attorney, Agent, or Firm* — Bachman & LaPointe, P.C.

(57) ABSTRACT

A ceramic material is applied to a part. The part is placed in a deposition chamber and a first electric potential is applied to the part. Components are evaporated for forming the material. The evaporated components are ionized. The first electric potential is modulated so as to draw the ionized component to the part. The modulation comprises maintaining at least an ion current density in a range of 2-1000 mA/cm$^2$.

20 Claims, 5 Drawing Sheets

CERAMIC COATING DEPOSITION

BACKGROUND

The disclosure relates to gas turbine engines. More particularly, the disclosure relates to thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes a NiCoCrAlY bond coat (e.g., low pressure plasma sprayed (LPPS)) and a yttria-stabilized zirconia (YSZ such as 7YSZ) thermal barrier coat (TBC). While the TBC layer is being deposited or during an initial heating cycle, a thermally grown oxide (TGO) layer (e.g., alumina) forms atop the bond coat layer. As time-at-temperature and the number of cycles increase, this TGO interface layer grows in thickness. U.S. Pat. Nos. 4,405,659 and 6,060,177 disclose exemplary systems.

Exemplary TBCs are applied to thicknesses of 0.05-1.0 mm and can provide in excess of 300° F. temperature reduction to the base metal (e.g., a Ni- or Co-based superalloy). This temperature reduction translates into improved part durability, higher turbine operating temperatures, and improved turbine efficiency.

U.S. Pat. No. 5,652,044, (the '044 patent) the disclosure of which is incorporated by reference in its entirety herein as if set forth at length, discloses a system for forming alternating TBC layers by switching between a plasma assisted physical vapor deposition (PA-PVD) mode and a non-plasma assisted physical vapor deposition (PVD) mode. Due to the active role of ions in the PA-PVD processes they often are also forms of ion-enhanced PVD (IE-PVD). The definition of PA is more general because other plasma species (other than ions: chemically active excited atoms and molecules, radicals, etc.) may also play important role in PA-PVD to obtain desired composition coatings (as will be clear from below). So, the PA-PVD process of the '044 patent is more fully defined (for purposes of discussion herein only) as PA(IE)-PVD. During PA(IE)-PVD stages, plasma ions bombard the surface of coated TBC and introduce modifications into TBC microstructure, which affect TBC thermal conductivity. Namely, sharp transitions from the microstructure of one deposition mode to the microstructure of the other deposition mode strongly influence the TBC thermal conductivity due to scattering of providing thermal conductivity phonons and photons on the transitions (which occurs at the interfaces between the microstructures). The alternating stages are of approximately equal duration. In one experiment, the layers of both modes were 2 µm; in another, the PVD layers were 2 µm and the PA(IE)-PVD layers were 1 µm. The equal thickness combination was identified as having a lower thermal conductivity than the unequal thickness combination and the respective single mode coatings.

Especially when used in sandy desert environments, engine components are subject to a particular form of fouling/damage known as molten sand attack or CMAS. CMAS is an abbreviation for "calcium-magnesium-aluminum-silicon (silicate)". Specific CMAS oxides include CAO, MGO, $Al_2O_3$, and $SiO_2$. CMAS components may form a eutectic with a relatively low melting point (e.g., approximately 1240 C). The molten CMAS material infiltrates into porous coatings (e.g., between the columns of columnar ceramic). This can alter the chemical composition of the coating and/or cause structural failure of the coating. Efforts to address CMAS have centered on improved barrier coatings. For example, U.S. Pat. Nos. 5,660,885, 5,871,820, 5,914,189, 6,720,038, 6,627,323, 6,465,090, all reference coatings relative to CMAS.

SUMMARY

One aspect of the disclosure involves an PA(IE)-EB-PVD method for applying a ceramic material to a part. The method comprises placing the part in a deposition chamber and applying a first electric potential to the part. Components are evaporated for forming the material. The evaporated components are ionized and chemically activated. The first electric potential is modulated so as to draw the ionized component to the part. The modulation comprises maintaining at least an ion current density in a range of 2-1000 $mA/cm^2$.

In additional or alternative embodiments of any of the foregoing embodiments, the maintaining may be over at least 50% of a depth from the top surface of the ceramic deposition.

In additional or alternative embodiments of any of the foregoing embodiments, the maintaining of the ion current density of 2-1000 $mA/cm^2$ is during deposition of a depth of at least 50% of a depth from the top surface of the ceramic deposition.

In additional or alternative embodiments of any of the foregoing embodiments, the ion current density is 2-100 $mA/cm^2$ at the first electric potential of 0.1-5 kV.

In additional or alternative embodiments of any of the foregoing embodiments: in a first stage, the ion current density is lower than in a second stage; and a duration of the second stage is less than the first stage.

In additional or alternative embodiments of any of the foregoing embodiments: in a first stage, the ion current density is lower than in a second stage; in the first stage, the ion current density is 0.1-1 $mA/cm^2$ at the first electric potential of 0.1-10 kV; and in the second stage, the ion current density is 10-800 $mA/cm^2$ at the first electric potential of 0.1-5 kV.

In additional or alternative embodiments of any of the foregoing embodiments, in the second stage the ion current density is 10-100 $mA/cm^2$ at the first electric potential of 0.1-5 kV.

In additional or alternative embodiments of any of the foregoing embodiments, the first electric potential is less in the second stage than in the first stage on average.

In additional or alternative embodiments of any of the foregoing embodiments, the part is a superalloy turbine part and the ceramic thermal barrier coating material is YSZ.

In additional or alternative embodiments of any of the foregoing embodiments, the ionizing is modulated.

In additional or alternative embodiments of any of the foregoing embodiments, the material is applied to a thickness of at least 0.05-1.0 mm.

Another aspect of the disclosure involves an apparatus for depositing material on a workpiece. The apparatus has a deposition chamber. Deposition material is at least partially within the deposition chamber. A first electron beam source is positioned to direct a first electron beam to vaporize a portion of the deposition material. An ionizing system is positioned to ionize and chemically activate the vaporized material and a reactive gas. A bias voltage source is connected to apply electric potential to the workpiece. A control apparatus is coupled to the bias voltage source and configured to maintain an ion current density in the range of 0.1-1000 $mA/cm^2$.

In additional or alternative embodiments of any of the foregoing embodiments: a crucible containing the deposition material; and an inductor over the crucible.

In additional or alternative embodiments of any of the foregoing embodiments, a plasma generator having electrodes and plasma generating oxygen gas source having an outlet directing the plasma-generating oxygen gas toward the substrate.

In additional or alternative embodiments of any of the foregoing embodiments, an arc discharge plasma generator having electrodes formed from the deposition material.

In additional or alternative embodiments of any of the foregoing embodiments, an arc discharge plasma generator has: a ceramic electrode; and a heater for heating the ceramic electrode up to temperature of ceramic electrical conductivity appearance.

The deposition conditions may provide low thermal conductivity and simultaneously high resistance against CMAS attacks on TBC ceramics.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
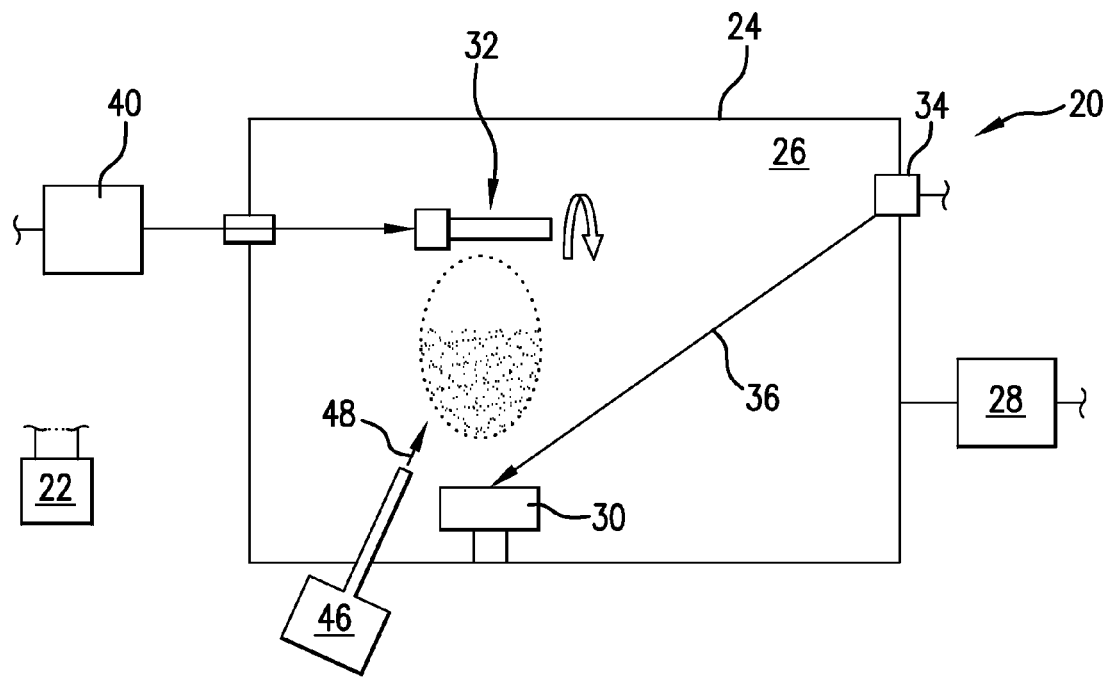
FIG. 1 is a partially schematic view of a coating system.

FIG. 1 shows an exemplary deposition system 20. Mechanically/electrically, the system 20 may represent any of numerous presently-available or subsequently designed systems. The system 20 has a controller 22 (e.g., a microcontroller or microcomputer) which, similarly, may be programmed or otherwise configured as is a present or subsequent controller; however, with further modification (discussed below). An exemplary system is based on that of the '044 patent. The PA-PVD intervals in the exemplary system (more particularly electron beam PA-PVD or PA-EB-PVD) may be partially similar to EB-PVD of the '044 patent. The exemplary system has further modifications to the PA-PVD intervals (also known as ion-enhanced electron beam physical vapor deposition that is PA(IE)-EB-PVD) of the '044 patent. An exemplary system 20 includes a chamber 24 having an interior 26 coupled to a vacuum source 28. Sources of reactive gases with or without inert gas sources are possible in system variations. A ceramic ingot 30 forms a source of material for a coating to be applied to a substrate (e.g., a superalloy turbine engine component 32 such as a blade, vane, combustor panel, or the like). An electron beam gun 34 is positioned to direct an electron beam 36 to a surface of the ingot for evaporating the ingot. A generator 40 is coupled to the substrate 32 for applying a DC and/or RF bias to the substrate. The pulse generator 40 may replace a baseline generator (e.g., of the '044 patent) if the latter is incapable of pulse operation. For example, the baseline generator may be on-off controlled to produce a longer duration source wave but lacking ability to pulse at durations much less than one second. A source 46 of a reactive gas flow 48 is shown coupled to the chamber. The reactive gas may serve as a make-up for components lost from the ingot 30. For example, in the case of a YSZ (zirconia $ZrO_2$+Y for stabilization) ingot, the gas may be oxygen to replace oxygen lost from the ingot. For example, zirconia during EB evaporation loses some oxygen atoms because of partial dissociation of zirconia under high-energy electron bombardment. So, in the space between the ingot 30 and the substrate 32, there are vapor with chemical formula $ZrO_x$ (x<2) and free oxygen atoms. The latter, being light particles, are disproportionately pumped out from the interior chamber 26 by the vacuum source 28. Thus, mainly vapor molecules $ZrO_x$ would reach the substrate 32 to form a deposit (coating) with non-stoichiometric formula and likely undesirable features. In order to increase oxygen content in the coating up to stoichiometric level due to chemical reaction of $O_2$ with $ZrO_x$ on the substrate surface, one directs the additional free oxygen flow 48 into the chamber 24 toward the substrate. Such an approach is referred to as reactive evaporation deposition. Ionization (and accompanying excitation and dissociation) of reactive gas (e.g., oxygen) and evaporated components in electrical discharge plasma within the deposition chamber is favorable for chemical reaction of gas and evaporated species because ionized (excited and dissociated) species are more chemically active. Such deposition mode is referred to as activated reactive evaporation deposition (that is PA-EB-PVD or PA(IE)-EB-PVD).

In the '044 patent such activated deposition mode occurs only during PA(IE)-PVD intervals (periods) when the substrate bias voltage is applied to the substrate serving as a cathode for the plasma/ion-generating discharge. In various present embodiments, chemical activation of species forming TBC may take place during the intervals both of PA(IE)-PVD and PA-PVD because the plasma/ion-generating discharge may be maintained during both intervals. This is discussed in further detail below. This maintenance of chemical activation allows obtaining stable stoichiometric TBC ceramics during entire deposition process.

Figure 2:
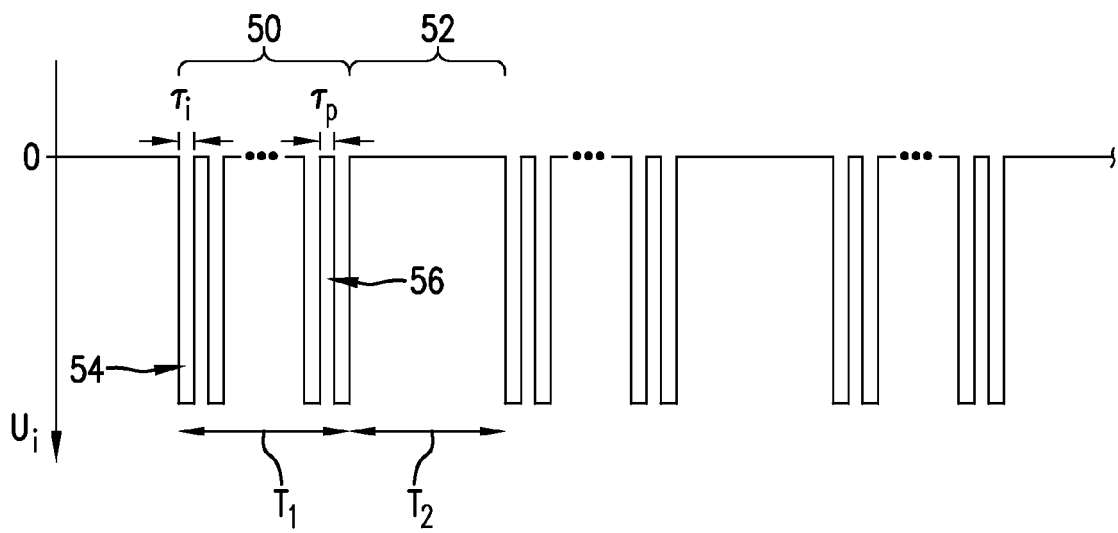
FIG. 2 is a plot of a potential applied to a part to be coated in the system of FIG. 1.

FIG. 2 shows the voltage applied to the substrate in a plurality of alternating PA(IE)-PVD/PA-PVD intervals 50 and PA-PVD intervals 52. The exemplary PA(IE)-PVD/PA-PVD intervals 50 each have a duration $T_1$ and the exemplary PA-PVD intervals 52 each have a duration $T_2$. During at least a major portion of the exemplary deposition (i.e., 50% of the TBC thickness) $T_1$ and $T_2$ are constant. Exemplary durations $T_1$ or $T_2$ may be generally similar to that of PA(IE)-PVD and PVD, accordingly, of the '044 patent (e.g., with both in the vicinity of one minute (e.g., 30-120 seconds, more narrowly, 45-75 seconds or, more broadly 10-1000 s)). The exemplary total numbers of the intervals 50 and 52 are between 20 and 200 apiece, more narrowly 30-100 apiece. Exemplary thicknesses applied in each of the layers are 1-15 micrometers, more narrowly 2-10 micrometers or about 5 micrometers.

However, as a modification to the method of the '044 patent, each PA(IE)-PVD interval $T_1$ is further divided into pulses 54 (PA(IE)-PVD) of a negative voltage of magnitude $U_i$ and pulse widths or durations $\tau_i$ separated by intervals 56

(PA-PVD) of width/duration $\Sigma_p$ of relatively neutral voltage (e.g., magnitude much less than half of $U_i$ and, more narrowly, less than 10% of $U_i$ or zero). Thus, the time structure of proposed ceramic coating deposition process is the following: PA(IE)-EB-PVD)/PA-EB-PVD . . . PA(IE)-EB-PVD)/PA-EB-PVD//PA-EB-PVD//PA (IE)-EB-PVD)/PA-EB-PVD . . . PA(IE)-EB-PVD)/PA-EB-PVD//PA-EB-PVD . . . (see FIG. 2) (where two slashes identifies the separation between intervals 50 ($T_1$) and 52 ($T_2$) and a single slash identifies the separation between the bias pulses 54 ($\tau_i$) and pauses 56 ($\tau_p$). Exemplary $\tau_i$ is less than or equal to 1 millisecond, more narrowly, 50-500 microsecond or 10-100 microsecond. Exemplary $\tau_p$ is greater than or equal to 0.5 microseconds, more narrowly, 10-100 microseconds. An exemplary duty cycle ($D=\tau_i/(\tau_i+\tau_p)$) of the pulses is between 0.1 and 0.99, more narrowly, 0.5-0.95, 0.6-0.9, or 0.8-0.9. Exemplary thickness of the TBC layer (e.g., a 7YSZ layer) is at least 50 micrometers, more narrowly, 0.05-1.0 mm, more narrowly 0.1-0.3 mm. The exemplary nominal magnitudes of pulsed substrate bias voltage $U_i$ are 0.5-10 kV, more narrowly 3-5 kV. Exemplary pulse repetition frequency ($F=1/(\tau_{i+}\tau_p)$) is 0.05-1000 kHz, more narrowly 0.2-20 kHz or 0.5-5 kHz or about 1 kHz.

The reason for dividing each PA-PVD interval ($T_1$) into pulses 54 (PA(IE)-PVD) of a negative voltage is to avoid arcing on the substrate surface during the initial time of deposition and further on the fresh coating surface. The arcing arises due to high-voltage substrate bias, oxide nature, and non-regular structure of coated surfaces. The arcing may greatly destroy/damage the substrate and coating surfaces. However, due to the existence of an arcing delay (up to 1 millisecond) from onset of bias voltage application, the system may prevent arcing by breaking off of bias voltage application. Thus, a pulse modulation of bias voltage may prevent arcing. Increase of either the bias voltage or substrate ion current density leads to decrease of arcing delay, therefore the duration $\tau_i$ should be decreased down to some hundreds or tens of microseconds as discussed above.

The duration $\tau_p$ may be chosen to be sufficiently large to ensure restoration of electrical conditions on the coated surface after the bias voltage pulses (e.g., recharging the surface). Exemplary values of pause duration $\tau_p$ were noted above and are less than $\tau_i$. In the '044 patent, practically continuous wave bias voltage is applied to the substrate during the PA-PVD stages as their duration is about 1 min, therefore arcing and its consequences inevitably arise in such processes.

The exemplary intervals 54 ($\tau_i$) are sufficient that a glow plasma discharge is maintained between the substrate (as a cathode) and the chamber walls (as an anode) in working gas medium to generate ions which are further accelerated toward the negatively biased substrate to provide the PA(IE)-PVD process. The exemplary duty cycles of the bias voltage pulses may provide effective use of time for plasma/ion generation. However such approach to fire and maintain plasma/ion generation discharge (as is also the feature of the '044 patent) has shortcomings because it needs introduction inert gas as addition to oxygen (an inert electrical positive gas, such as argon, facilitates firing and maintaining of the discharge against oxygen (an electrical negative gas)). The excess of inert gas pressure leads to the undesirable effect on TBC microstructure and provokes electrical breakdowns in the evaporating EB gun.

Below, options are discussed for avoiding/reducing employment of inert gases. Frequent interruption (pulse modulation) of the bias voltage by the PA(IE)-PVD/PA-PVD intervals may have benefit in additional creation of sharp microstructure transitions (obstacles, scattering phonons and photons) and decreasing the TBC thermal conductivity, caused by heat transfer by phonons and photons through TBC. Thus, a many-fold interruption of microstructure growth process may decrease the TBC thermal conductivity by both: alternating PA(IE)-PVD/PA-PVD intervals; and interruption within PA(IE)-PVD intervals. Alternative pulse distributions are disclosed in U.S. Ser. No. 13/043,948 (the '948 application) filed Mar. 9, 2011 and the disclosure of which is incorporated by reference herein in its entirety as if set forth at length.

Thus, differences relative to the '044 patent may include: 1) the periodically interrupted substrate bias (relatively short bias pulses with duration $\tau_i$) which ensures avoiding arcing on the substrate (in '044, the bias is applied for the long intervals (periods), $T_1 >> \tau_i$, that is practically continuous from the arcing perspective (but not plasma generation and chemical activation of deposited species during the long intervals $T_2$)); 2) the constant/continuous plasma generation ensures fully stoichiometric coatings, stable against CMAS (in the '044 patent, chemical reactions of active species on the substrate surface occur only during bias application intervals $T_1$ (when plasma is generated), which is about of half of the total deposition time as $T_1 \sim (T_1+T_2)/2$. In the present case constantly generating plasma (that is ionized and activated ceramic vapor and oxygen) allows depositing of a stoichiometric YSZrO$_2$ layer through the whole TBC thickness.

TBC is formed from ceramic vapor, which flies toward the substrate continuously due to thermal velocity independently of bias application/non-application. Some part of the vapor reaches the substrate in the ionized state. In the exemplary deposition process this part is not significant. Thus, although the bias voltage attracts ceramic ions to the substrate, the role of these ions in ceramic mass transfer to the substrate is not important. The important role of ions consists in energy transfer to the growing coating and to serve as a hammer upon coating materials. Then ion bombardment enhances stability against CMAS attacks (this effect is discussed below in details). As well, bias application added to the plasma generation leads to surface bombardment by accelerated ions and modification of the structure of the growing layer. The modification is change of mutual disposition of molecules in TBC structure and molecule package density, therefore just after bias application sharp change of growing layer structure parameter occurs and phonon/photon scattering is enhanced namely at the interface "bias non-application/bias application". Then decrease of TBC thermal conductivity is available.

The accelerated (by the bias voltage) ions may be considered to act as a hammer on coating materials because they hammer (strike) coating material atoms during collisions, that is they transfer a kinetic moment to atoms on the substrate surface. Due to the additional moment (or energy), the coating atoms shift closer each to other, the coating becomes tighter/denser, and voids are eliminated. The coupling between the coating atoms as well as between the coating atoms and the substrate atoms becomes stronger, the adhesion much better, and the coating quality much higher. CMAS molecules have great difficulty penetrating into the coating in such situation.

Figure 3:
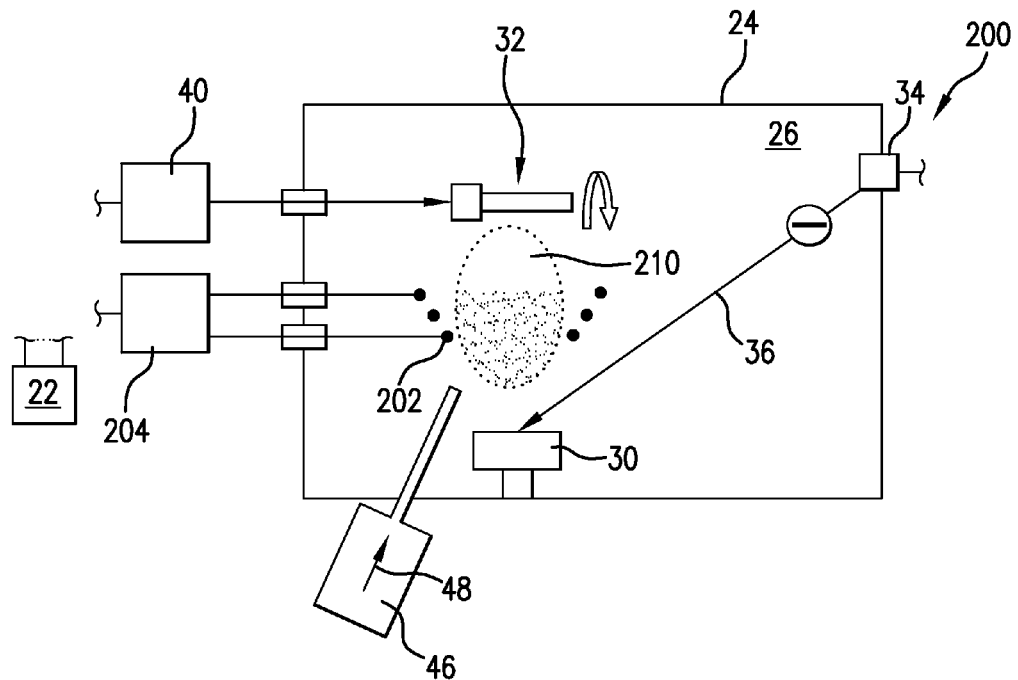
FIG. 3 is a partially schematic view of an alternative coating apparatus/system.

FIG. 3 shows a system 200 which may be otherwise similar to the system 20 and in which similar components have similar numbers. The system further includes an inductor coil 202 coupled to an RF generator 204. The RF generator 204 and inductor coil 202 serve to ionize the ingot vapor and reactive gas and generate a plasma 210. Although a DC ionization source is also possible in place of the RF generator 204, the use of an RF generator is less sensitive to ceramic deposition on the inductor windings because the RF energy is better able to penetrate through dielectric ceramic deposits. The use of RF inductor provides maintaining stable plasma discharge without additional inert gas introduction into the chamber and at lower gas pressures (~1 mTorr) than it was in the '044 patent. As discussed above, this leads to more preferable TBC microstructure for obtaining low heat transfer through TBC and more favorable conditions for EB gun operation.

Figure 4:
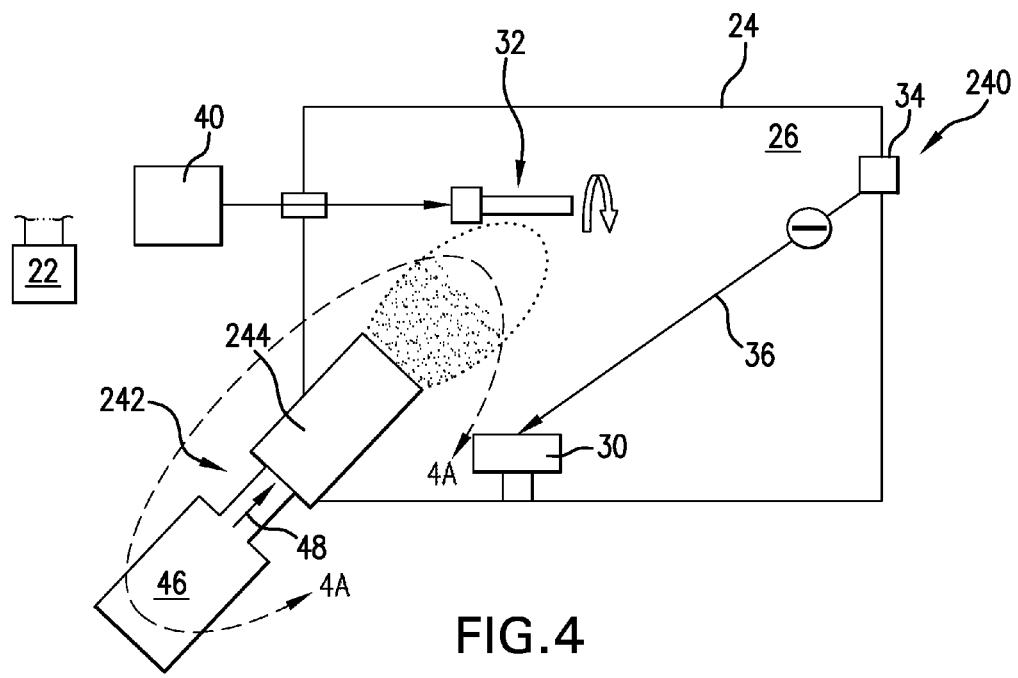
FIG. 4 is a partially schematic view of a second alternative coating apparatus/system.
Figure 4A:
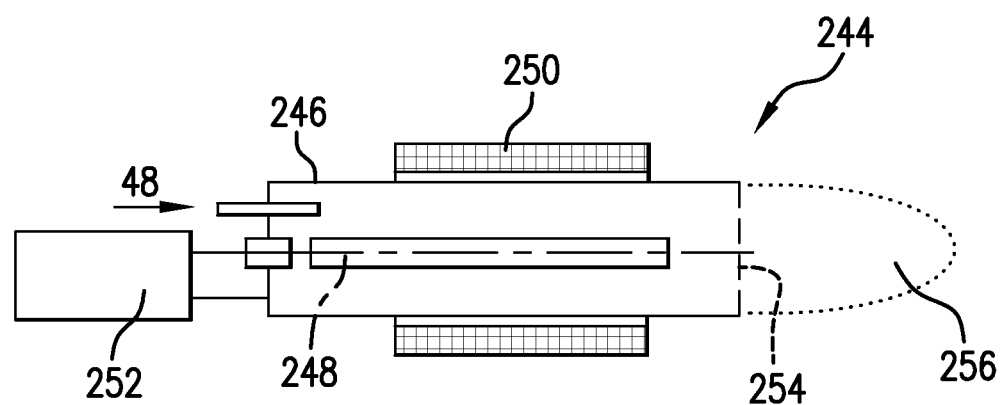
FIG. 4A is an enlarged view of a plasma gun of the apparatus/system of FIG. 4

FIG. 4 shows a system 240 which also may be similar to the system 20 but includes a plasma jet (plasma gun, plasma source) 242. The exemplary plasma jet comprises a plasma gun 244 receiving a flow of reactive gas 48 from the source 46. FIG. 4A shows an exemplary gun 244 with cylindrical electrode maintaining glow or cathode arc discharge for oxygen plasma/ion generation. A first electrode 246 might be a cathode and a second electrode 248 might be an anode. For robustness against the ionized reactive gas the electrodes 246 and 248 may be cold (non-heated) metallic ones. Exemplary metallic discharge electrodes are formed from one or more of the metals in the desired TBC (e.g., Zr and/or Y for the YSZ coating or a desired dopant therefore). To intensify the discharge at very low pressures (≤1 mTorr) and for more uniform wear of the electrodes, a magnet 250, generating an axial magnetic field, may be used. The benefit from the axial magnetic field is caused by azimuth rotation of plasma species and cathode spots. A power source 252 supplies the discharge within the gun 244 by either DC or pulse modulated DC, or AC, or RF, or microwave (MW) energy. The exemplary gun end 254 is an outlet grid wall for plasma/ion flow. Thus, the reactive gas 48 is ionized within the gun 244 with the help of electrical discharge and forms oxygen plasma/ion flow 256 toward the substrate. Use of the gun allows deposition to the carried out at a lower gas pressure than in the basic system.

Such a plasma source is distinguished, for example, from plasma guns employed in plasma spray systems. Whereas, plasma spray guns generate a flow of liquid/melted coating material, the exemplary plasma guns generate only a molecular gas plasma flow.

Such a plasma source generates ions, chemically reactive atoms, radicals, etc. Periodically, the substrate is bombarded by accelerated ions (from evaporated material and gas) and all time using chemically reactive species (including non-accelerated ions) for chemical reactions to obtain stoichiometric coatings. Periodical ion bombardment is used for creating sharp changes of TBC microstructure and obtaining low thermal conductivity as well as for ion treatment of TBC against CMAS attacks. In the '044 patent, the stages of chemical reaction without ion bombardment are absent. Also evaporated species go towards the substrate mainly due to their thermal energy; during the bias pulses, the ionized part of the species additionally goes to the substrate due to its bias voltage. The electron beam practically does not ionize gas and vapor.

Figure 5:
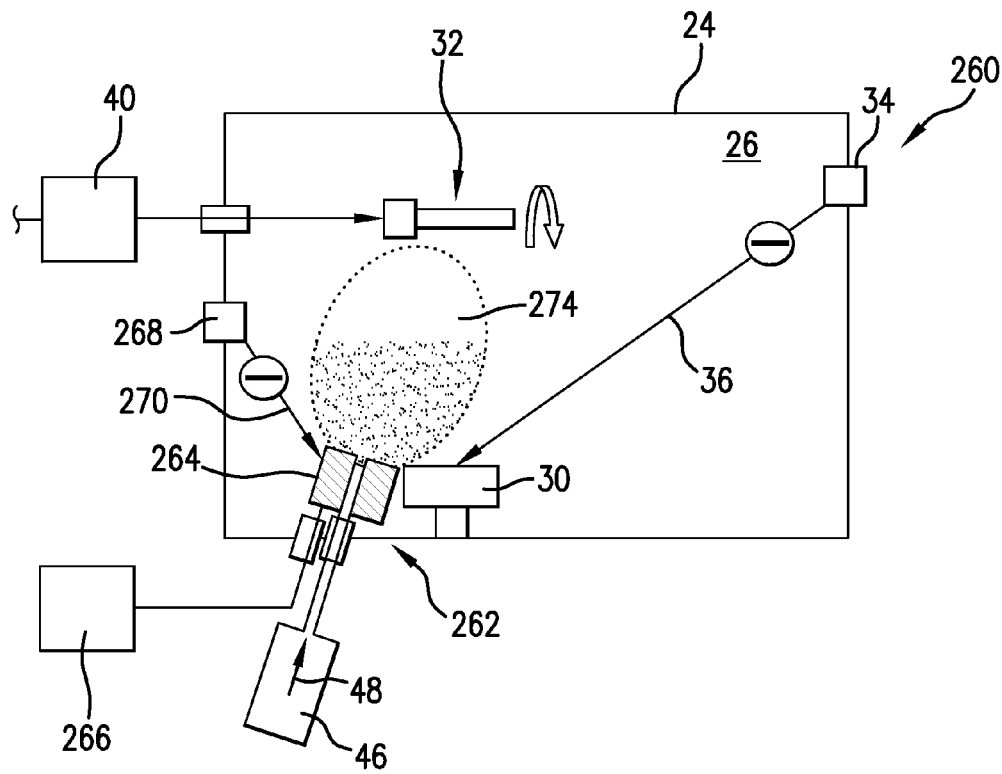
FIG. 5 is a partially schematic view of a third alternative coating apparatus/system.

FIG. 5 shows a system 260 which may be similar to the system 20. The system 260 further includes a hollow cathode arc plasma source (plasma gun) 262 for generation of a reactive ion plasma from the reactive gas 48. The source 262 includes a tube-like cathode 264 and a power source 266 (e.g., DC or pulse modulated DC, or AC, or RF) coupled thereto. An exemplary hollow cathode 264 may be formed of material representing one or more components of the coating and/or ingot. For example, with a YSZ ingot, a YSZ cathode may be used to minimize introduction of impurities. To the extent that a ceramic cathode such as YSZ is electrical conductive at elevated temperatures, a supplemental heater (e.g., an electron beam gun 268 directing an electron beam 270 to the cathode 264) may be provided. FIG. 5 further shows a flow 274 of reactive ion plasma ejected by the source 262 toward the substrate. Use of the hollow cathode arc plasma source gun allows deposition to the carried out at a lower gas pressure than in the basic system.

Figure 6:
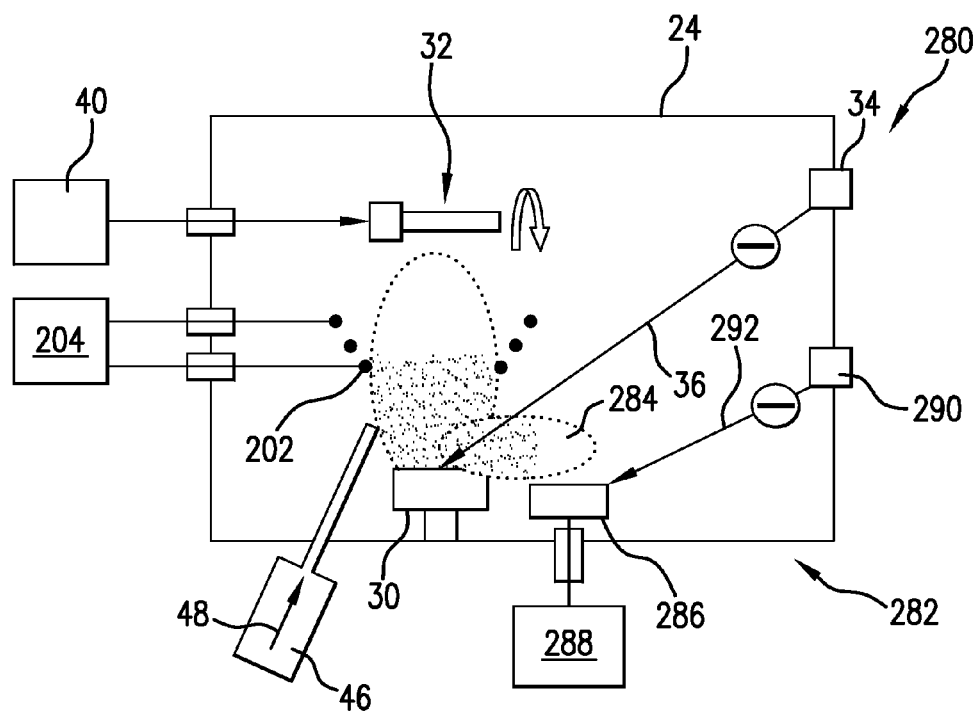
FIG. 6 is a partially schematic view of a fourth alternative coating apparatus/system.

FIG. 6 shows a system 280 which may be generally similar to the system 200 but further including an arc discharge source 282. The exemplary arc discharge source generates a plasma 284 which, in turn, provides charged species to support the induction plasma discharge. The source 282 includes an anode 286 (e.g., a ceramic anode for supporting arc discharge over the evaporated ingot surface; the ingot surface serving as a cathode of the arc discharge). Exemplary anode material is ceramic, more particularly, it may be identical to or otherwise similar to the material of the ingot. A power source 288 (e.g., DC or pulse modulated DC, or AC, or RF) provides power to the anode 286. In a similar fashion to the EB gun 268, an EB gun 290 may act as a heater and emit an electron beam 292 to heat the anode to a temperature where effective electrical conductivity appears in the ceramic of the electrode (anode). Use of the arc discharge plasma source (as opposed to a plasma gun) allows deposition to the carried out at a lower gas pressure than in the basic system.

The exemplary systems, schematically shown in FIG. 3-FIG. 6, may be operated without inert gas for firing and maintaining plasma/ion generating discharge; only the reactive gas forming TBC is employed. Via pulse modulation of bias voltage during PA(IE)-PVD intervals, arcing may be avoided and the value range of bias voltage may be wider than in the '044 patent and the like systems. This may provide effective ion cleaning and ion enhancing of TBC adhesion as well as ion modification of TBC microstructure, resulting in decrease of the TBC thermal conductivity. Whereas the '044 patent uses alternate intervals EB-PVD//PA(IE)-EB-PVD, this example uses intervals of PA-EB-PVD/PA(IE)-EB-PVD/PA-EB-PVD with chemical activation of TBC formation by plasma species during the whole deposition process that is during all the intervals of deposition time structure. This ensures formation of a stoichiometric ceramic TBC to provide good performance at elevated temperatures (so as to not further react/oxidize when in use).

Additional oxygen is introduced in the PA-EB-PVD and PA(IE)-EB-PVD processes as in the conventional EB-PVD for TBC, because dissociation of the ceramic ingot material under energetic EB bombardment occurs. Oxygen, released during the destruction of ceramic molecules of the ingot, is pumped out of the deposition chamber. To compensate for oxygen losses, it is introduced supplementally into the chamber.

A baseline EB-PVD system and method (not ion-enhanced) and a baseline PA(IE)-EB-PVD system may both produce coatings with vulnerabilities to CMAS attack. In the baseline EB-PVD system, the substrates are rotated during to provide uniform TBC deposition. This yields periodic shadowing of coated areas, and as a result, formation of a layered TBC structure. Comparatively dense layers deposited at incidence angles close to normal alternate with porous layers formed under shadowing conditions. At operational conditions, molten CMAS first penetrates into coarse inter-columnar voids. From there CMAS easily infiltrates inside YSZ columns along porous layers, causing cracking and failure of these columns The baseline PA(IE)-EB-PVD system and its operational parameters may be characterized by ion treatment of column tops to provide more denser microstructure. This effect is used to create alternating layers with different microstructures (that is the layered TBC) for minimizing TBC thermal conductivity when PA(IE)-EB-PVD alternates with pure EB-PVD. Such an approach is discussed in details in the previous sections of the application. That alternating approach (ion treatment/non ion treatment) may still leave transversely porous sublayers subject to CMAS infiltration parallel to the TBC surface. Nevertheless, some porosity is needed for lowering TBC thermal conductivity. Moreover, by the same reason, the very moderate (say, very small) transverse (micro/nano)porosity may be desired in the layers deposited by PA(IE)-EB-PVD. Because of this, the very high intensity of ion bombardment (or the very high specific power $P_i$ of ion flow to the substrate that is equals $P_i=j_i \cdot U_b$, where $j_i$ is the substrate ion current density, $U_b$ is substrate substrate negative bias voltage) is not useful for lowering TBC thermal conductivity. Experiments suggest $j_i \leq (1-2)$mA/cm$^2$ at $U_b$ in the range of 0.1-10 kV to provide sufficient lowering TBC thermal conductivity and to maintain characteristics of good adhesion and stoichiometry resulting from ion bombardment, commonly used in IE-PVD processes.

Thus, there is a trade-off between low thermal conductivity of the TBC and its resistance to CMAS attack. Low conductivity suggests a low density layered TBC; CMAS resistance suggests a dense non-infiltrating microstructure. An advantageous combination of both properties is achieved by closing the transverse pores on their ends along the column sides.

Thus, a modified system and/or operational parameters may be configured to close porosity not merely on the surface (column tops) but depthwise along column sides. This may avoid CMAS infiltration into the columns. Because the TBC/column surfaces are otherwise rough, ion treatment may extend down along column sides not merely along the column tops. For this, the ion shell around the TBC surface may be as small as possible.

Figure 7:
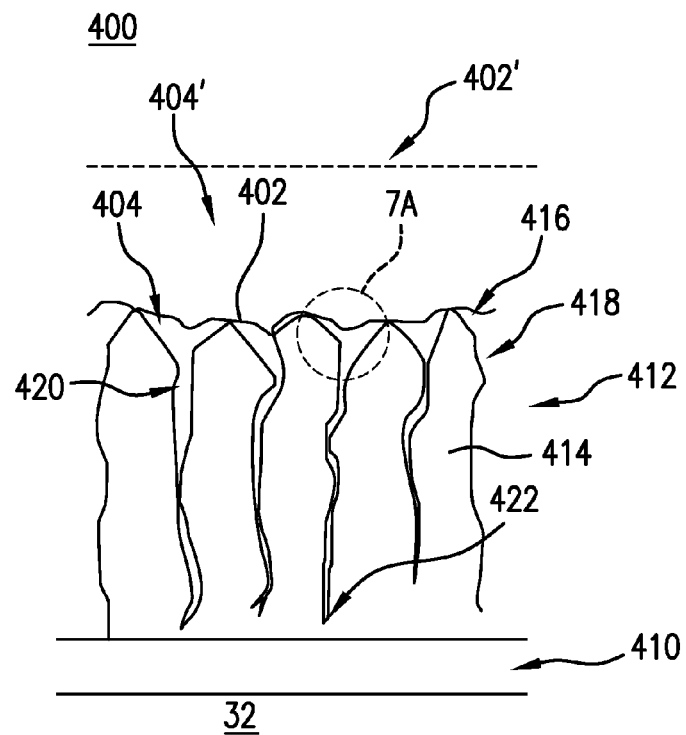
FIG. 7 is a schematic sectional view of a thermal barrier coating (TBC) during deposition.
Figure 7A:
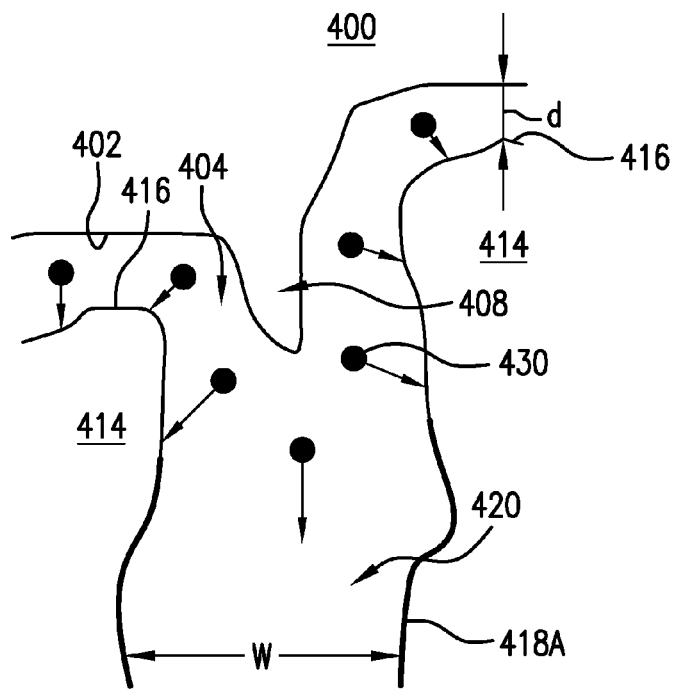
FIG. 7A is an enlarged view of a surface region of the TBC of FIG. 7.

FIG. 7 shows the plasma 400 having a boundary 402. A bondcoat 410 (e.g., an MCrAlY) is between the substrate 32 and the TBC 412. The individual columns 414 have tops 416 and sides 418. Intercolumnar voids/pores 420 appear having characteristic widths w (FIG. 7A). Also there are microscale approximately horizontally directed intracolumnar voids (not shown).

The ion shell 404 is between the boundary 402 and the TBC. Ion shells form near a negatively biased electrode immersed in electron-ion plasma because the plasma isolates itself from the electrode with high negative potential by positive space charge. The space charge is generated by positively charged ions extracted from the plasma toward the negative electrode. Electrons are reflected by the negative potential and practically do not affect the space charge, therefore the shell is named as an "ion" shell. The electrode/substrate bias voltage practically entirely applied across the ion shell, because the voltage drop across the plasma is relatively small (due to its high electrical conductivity). The plasma boundary 402 serves as a source of plasma ions, then accelerated within the ion/plasma shell toward the electrode/substrate. When the shell thickness d (FIG. 7A) is small, the plasma boundary goes practically parallel to the substrate surface or the top surface features of coating on the substrate. The latter case is shown in by the boundary 402 and shell 404 in FIG. 7A. When the shell thickness is large (see the thick shell 404' and the far off plasma boundary 402' in FIG. 7), the boundary 402' is parallel to the substrate contour (or even an averaged/smoothed profile thereof) and does not reflect features of the coating surface topology. Accordingly, ion treatment of coarse coating surface parts is different for a thin shell relative to a thick shell.

When the shell thickness is large (see the shell 404' and the plasma boundary 402' in FIG. 7), the plasma ions generally go towards the substrate with near zero angle of incidence onto the substrate surface under the TBC, affect mainly the column tops 416 with some falling down into the intercolumnar voids/pores 420 and sliding along the column sides 418. Since the latter ions may bombard the side surface at glancing angles, the ion effect is minimal (only void bottoms 422 take/pick up ion energy). Projections on the column top and the side surface lead to a shadow effect, thereby reducing the percentage of ions entering the voids/pores 420 and the depth of their penetration (that is leaving a shadowed part of the side surface without any ion treatment). Summarizing, such mode of ion treatment is suitable mainly for obtaining the layered TBC with low thermal conductivity but not CMAS resistance.

A variant of IE PVD technology as ion beam assisted deposition (IBAD) has previously been used depositing a ceramic TBC (see, for example, U.S. Pat. No. 7,838,083). This method employs a directed ion beam ejected from a far off ion beam gun. However the treatment with ion beam with straight-forward trajectory inevitably leads to the shadow effect on the coarse TBC surface in spite of rotation and other movements of the substrate. Moreover, an exemplary maximum current density in ion beams is about 1 mA/cm$^2$ because of push aside action of ion space charge within the beams. Thus, the IBAD method is non-suitable for ion treating of column sides to provide a CMAS-resistant TBC.

FIG. 7A shows the case with a small thickness d of the ion shell 404 and shows local penetration 408 of the plasma into the voids 420. This allows a deeper origination/generation and more dense (concentrated-more ions per second per surface area of the coating) penetration of ions 430 into the voids 420, thereby providing a greater densification of the column side surfaces that closes side ends of the transverse pores in the TBC columns. Ions emitted from the penetrated (into the voids 420) plasma boundary 402 bombard the column side surface at near-normal incidence with highest effect. It may be concluded such mode of ion treatment is suitable for obtaining dense side column surface and, in result, preventing CMAS infiltration into the TBC columns.

The bold portions 418A of column sides 418 in FIG. 7A depict densified column side surfaces treated on the earlier stages of deposition, so, ions impact on the just deposited surfaces when these surfaces (shown by thin lines) are close to the column tops, and ions are able to reach these side surfaces. When the ion shell is thinner (d), the plasma boundary deeply dips into intercolumn voids and a deeper/lower portion of the side surface 418 is under ion treating at the given moment of TBC deposition.

The thickness of the ion shell in vacuum conditions is defined by well-known formula of Child-Langmuir for space charge layer:

$$j_i[A/cm^2] = 5.46 \cdot 10^{-8} \frac{U_i^{3/2}[V]}{\sqrt{M_i} \, d^2[cm^2]}$$

where $j_i$ is ion current density, $U_i$ is voltage across the ion shell (in practice essentially equal to substrate bias voltage $U_b$), $M_i$ is molecular mass of ions, d is thickness of the ion shell (FIG. 7A).

At $U_1=100$ V and d=20-30 μm we have $j_i \sim 1$ A/cm$^2$ for Zr$^+$ ions and other possible ions (e.g., ZrO$_2^+$, ZrO$^+$, and the like). However, our experiments showed that the effect of ion enhancing on CMAS-resistance occurs already at much lower ion current density. So, the value of 1 A/cm$^2$ may be taken as an upper limit for substrate ion current density. From the experiments, the lower limit may be taken as 2-10 mA/cm². From this, we may say: the power of ion/plasma generating discharge and the density of plasma are to provide the substrate ion current density within these limits. The substrate bias voltage range may be 0.1-10 kV.

However, as it was said above, ion treatment with $j_i \sim (1-2)$ mA/cm² begin to decrease TBC thermal conductivity that is caused by excess of TBC densification, therefore the use of higher substrate ion current density at $U_b$ up to 10 kV should be balanced between CMAS attack standing and thermal conductivity of TBC. For example, a narrower $j_i$ range of 2-100 mA/cm² at $U_b$ of 0.1-5 kV over at least 30-50% of the depthwise deposition or during at least 30-50% of the time of deposition before its conclusion is a balanced one. The $j_i$ range of 2-100 mA/cm², on one hand, preserves some (small) porosity and layered microstructure of TBC with low thermal conductivity. On other hand, these $j_i$ values provide enough densification of TBC microstructure and, hence, improved CMAS-resistance as compared with TBC obtained with $j_i$ smaller than (1-2) mA/cm². Further, the higher the ion current density $j_i$, the higher the risk of destroying the layered microstructure and increasing thermal conductivity is. Therefore, 2-100 mA/cm² are good balanced values. The figures 30-50% are presented the minimal permissible interval of the deposition process when we obtain desired CMAS resistance. That is 50-70% may be with the conventional $j_i$, providing low thermal conductivity. Note that it may be desired to have the increased $j_i$ at the terminal portion of TBC deposition process, when the upper/top part of TBC grows, because this part ensures CMAS resistance. Yet more narrowly, such ion current density may be 2-50 mA/cm². Such densities may occur over at least 50% of the depth and/or time before finishing TBC deposition.

This may entail maintaining d in a range of tens-hundreds micrometers, more narrowly, 50-150 μm or about 100 μm.

Note, d is essentially a notional/virtual parameter that is not measured normally directly during operation of a coater. The thickness may be directly measured only in a special complex scientific set-up. Usually, a value of d may be calculated with the Child-Langmuir formula. Therefore, word or parameter "ion shell" or d is used for explanation of physical basis of the phenomenon.

Control may maintain the desired condition by measuring substrate ion current (defining ion current density) and by regulation electrical power of a plasma generator (defining plasma density and, accordingly, substrate ion current density) so as to maintain with a closed back loop the desired substrate ion current. The simple way to do measurement of the ion current density is measuring the pulse amplitude of the substrate current $I_i$ taking into account the pulse modulation of substrate bias voltage. Then the ion current density $j_i$ is defined by formula $j_i = I_i/S$, where S is the whole substrate surface area. The ion current density may be determined also with a special ion collector (with a defined ion collecting area) placed on/near the substrate. Assuming the square shape of ion current pulses, one can find the average substrate ion current $I_{s.average}$, which is about the average output current $I_{g.average}$ of the pulse generator/modulator 40 supplying the bias pulses applied to the substrate. The ratio between the above mentioned parameters may be expressed by the following formula:

$$I_{g.average} \approx I_{s.average} = D_t I_i = D_t j_i S,$$

where $D_t$ is the total duty factor (see FIG. 2):

$$D_t = DT_1/(T_1+T_2) = \tau_i T_1/(\tau_i+\tau_p)(T_1+T_2).$$

Thus, one can defines $I_{g.average}$ for the chosen $j_i$, the given substrate loading (S) and the time parameters of the substrate bias pulses ($\tau_i$, $\tau_p$, $T_1$, and $T_2$). Then control of electrical power of the plasma generator may maintain the defined value of $I_{g.average}$.

A further variation involves a multi-stage PA(IE)-EB PVD TBC process. In an exemplary two-stage process, in the first stage, the substrate ion current density $j_i$ is relatively low (e.g., ~0.1-1 mA/cm² at substrate negative bias voltage $U_b$ of 0.1-10 kV) with modulation of $U_b$ as in the aforementioned '948 application. This may be over an interval accounting for at least 70-95% of the thickness and/or time, more particularly, 85-95%. Thereafter, in a brief second stage, just before the end of deposition, the current density is increased up to value as high as possible (e.g., up to 0.01-1.0 A/cm²) at voltage $U_b$ of 0.1-10 kV. During the second stage the intervals without ion enhancing that is pure EB PVD is deleted. This second stage may represent 5-30% of total thickness, more narrowly 5-15%. The exemplary second stage may be more narrowly at a current density of 0.01-0.80 A/cm², more narrowly, 0.01-0.1 A/cm² at voltage $U_b$ of 0.1-5 kV.

This approach provides a relatively dense/low-porosity TBC microstructure with low thermal conductivity for the larger underlying part of TBC and simultaneously ensures high CMAS-resistance for the upper highest-density part of TBC, which exposes to CMAS attack. The approach employs technological deposition process with relatively low thermal load (to avoid coating and substrate overheating as well as diffusion wash-out of layered TBC structure with sharp boundary between alternating sublayers deposited, as it is said earlier, alternatively by PA(IE)-EB-PVD)/PA-EB-PVD . . . PA(IE)-EB-PVD)/PA-EB-PVD//PA-EB-PVD//PA(IE)-EB-PVD)/PA-EB-PVD . . . PA(IE)-EB-PVD)/PA-EB-PVD//PA-EB-PVD . . . (see FIG. 2) (where two slashes identifies the separation between intervals 50 and 52 and a single slash identifies the separation between the bias pulses 54 and pauses 56) and low rate of ion sputtering (to avoid decreasing deposition rate). The danger from CMAS attack for the first underlying lower-density part of TBC is much smaller than for the top highest-density part of TBC as the intercolumn void/pore widthness w (FIG. 7) is smaller (FIG. 7A) and working temperature of TBC region is lower near the void bottom.

One or more embodiments have been described. Nevertheless, it will be understood that various modifications may be made. Details of the particular turbine engine part or other piece and the particular coating material may influence details of any given deposition. Accordingly, other embodiments are within the scope of the following claims.

What is claimed is:

1. A method for applying a ceramic thermal barrier coating material to a part, the method comprising:
    placing the part in a deposition chamber;
    applying a first electric potential to the part;
    evaporating components for forming the material;
    ionizing the evaporated components; and
    modulating the first electric potential so as to draw the ionized components to the part, wherein:
    in a first stage, the ion current density is lower than in a second stage;
    in the first stage, the ion current density is 0.1-1 mA/cm² at the first electric potential of 0.1-10 kV; and
    in the second stage, the ion current density is 10-800 mA/cm² at the first electric potential of 0.1-5 kV.

2. The method of claim 1 wherein:
    the maintaining of the ion current density of 10-800 mA/cm² is during deposition of a depth of at least 25 micrometers.

3. The method of claim 2 wherein during said deposition of said depth:
   oxygen is introduced to the deposition chamber; and
   inert gas is not introduced to the deposition chamber.
4. The method of claim 1 wherein:
   a duration of the second stage is less than the first stage.
5. The method of claim 1 wherein:
   in the second stage the ion current density is 10-100 mA/cm$^2$ at the first electric potential of 0.1-5 kV.
6. The method of claim 1 wherein:
   the first electric potential is less in the second stage than in the first stage on average.
7. The method of claim 1 wherein:
   the part is a superalloy turbine part and the ceramic thermal barrier coating material is YSZ.
8. The method of claim 1 wherein:
   the ionizing is modulated.
9. The method of claim 1 wherein the material is applied to a thickness of at least 0.05-1.0 mm.
10. The method of claim 1 wherein over a majority of a depth of deposition:
    a bias amplitude is 0.1-10 kV; a
    a bias duty cycle is 0.3-0.9; and
    a bias pulse frequency is 0.05-100,000 kHz.
11. The method of claim 1 further comprising:
    introducing oxygen to the deposition chamber.
12. The method of claim 11 wherein:
    an RF inductor is used to maintain plasma discharge without additional inert gas introduction.
13. The method of claim 1 wherein:
    the second stage accounts for 5-30% of a coating thickness.
14. The method of claim 13 wherein:
    the first stage accounts for 70-95% of a coating thickness.
15. The method of claim 14 wherein:
    the second stage occurs after the first stage.
16. The method of claim 13 wherein:
    the second stage occurs after 70-95% of a coating thickness has been deposited.
17. The method of claim 16 wherein:
    a total coating thickness is 0.1 to 0.3 mm.
18. The method of claim 16 wherein:
    a total coating thickness is at least 50 micrometers.
19. The method of claim 18 wherein:
    the second stage deposits at least 25 micrometers.
20. The method of claim 16 wherein:
    the second stage deposits at least 25 micrometers.

* * * * *